United States Patent [19]

Galbraith

[11] Patent Number: 4,945,267

[45] Date of Patent: Jul. 31, 1990

[54] INTEGRATED CIRCUIT BUS SWITCHING CIRCUIT

[75] Inventor: Douglas C. Galbraith, Fremont, Calif.

[73] Assignee: Actel Corporation, Sunnyvale, Calif.

[21] Appl. No.: 295,402

[22] Filed: Jan. 10, 1989

[51] Int. Cl.$^5$ ............... H03K 17/687; H03K 3/26; G05F 1/40

[52] U.S. Cl. .................. 307/571; 307/270; 307/303.2; 307/576; 307/579; 307/585; 323/284; 323/289

[58] Field of Search ........... 307/243, 254, 270, 303.2, 307/571, 576, 585; 323/284, 289; 330/270, 273, 262

[56] References Cited

U.S. PATENT DOCUMENTS 4,061,930  12/1977  Nerem .................. 307/243

Primary Examiner—Stanley D. Miller
Assistant Examiner—Trong Quang Phan
Attorney, Agent, or Firm—Lyon & Lyon

[57] ABSTRACT

A circuit is provided for switching an internal bus of an integrated circuit between an input/output pad on the integrated circuit and a circuit node of the integrated circuit. A first switch is connected between the input/output pad and the internal bus. A second switch is connected between the circuit node and the internal bus. A high voltage detector senses the presence or absence of a voltage exceeding a preselected threshold on the input-output pad. The high voltage detector assumes a first state if the voltage on the input/output pad exceeds the preselected threshold, and assumes a second state if the voltage on the input/output pad does not exceed the preselected threshold. Switch control circuitry responsive to the high voltage detector activates either the first or second switch depending upon the output of the high voltage detector. Circuitry is provided to prevent the first and second switches from being active simultaneously and for lowering the capacitance of the input/output pad.

2 Claims, 2 Drawing Sheets

INTEGRATED CIRCUIT BUS SWITCHING CIRCUIT

BACKGROUND OF THE INVENTION

1. Field Of The Invention

The present invention relates to integrated circuit products which require an external high voltage source to supply programming voltage and current to internal elements. More particularly, the present invention relates to circuitry for multiplexing both high voltage and low voltage sources to a single input pad of an integrated circuit.

2. The Prior Art

Most programmable products require a high external voltage source to supply the voltage and current to program their internal elements. For example a PROM needs an external 20 volt supply to program its memory cells. This programming voltage is normally routed to an internal bus which rests at 5 volts when not programming a cell, and is switched to the higher voltage during programming.

Some of these products have a further limitations in that there are not enough I/O pads to uniquely handle all of the logic inputs, outputs, and power supply inputs, plus this internal programming voltage input. Some of these functions are multiplexed onto one pad in these products. For example, a PROM only needs the 20 volt supply during programming, and does not need chip select during programming; so one pad could handle both functions.

The requirements of switching the power supply connection on an internal power bus, and multiplexing the external power connection with a logic function on a single pad presents some difficult design problems.

Some prior art designs have avoided the multiplexing problem by adding a pad dedicated to supplying only the programming power bus. This approach obviously adds pins to the package which increases its cost to the customer, since it consumes more board space on the product. It may also force multiplexing of other logic signals which could cost speed since the two signals must share the same data path. Therefore, high speed designs with limited pins avoid this approach.

Some prior art products use a design which multiplexes a logic signal and the programming supply onto a single pad. As long as the input signal voltage is below the VDD voltage level of the power supply, power is drawn from $V_{DD}$ to a node through a diode forward biased between $V_{DD}$ and the node. When the pad voltage exceeds $V_{DD}$, a second diode conducts connecting that internal node to the pad.

While this approach doe function to multiplex the supply and logic signals, it has several practical problems associated with it. First, the voltage on the internal bus depends on the current drawn through the diodes. If no current is drawn, this voltage could drift up to $V_{DD}$ only to drop immediately when current begins to flow. This internal bus voltage is not regulated and is capable of varying by a diode drop.

Second, noise on the logic signal could alter the internal bus voltage. Since the trip points of the logic mode and power supply mode of the pad are equal to logic high, approximately 5 volts, there is no "dead zone" to provide noise margin.

In addition, the pad can not sink current from the internal power bus, it can only source current because of the diode. So, the internal bus could float higher than either $V_{DD}$ or the high voltage supply if current were driven into it by for instance a charge pump. A floating power bus could damage devices, cause latch up in CMOS circuits, or cause other circuits to malfunction.

Finally, the diode connected to the pad could significantly increase the pad capacitance, which typically should be less than 5 pF for a logic pin. A programming bus generally must supply a large amount of current. The IR drop of a diode is reduced by increasing its junction area. A large current requires a large junction connected to the pad. The increased capacitance because of the large size of this junction could dominate the total pad capacitance.

BRIEF DESCRIPTION OF THE INVENTION

A circuit is provided which allows an internal bus in an integrated circuit to be switched between a circuit node, internal to the integrated circuit, usually at a voltage internal to that integrated circuit, such as $V_{DD}$ or ground, and an externally-supplied voltage such as a high programming voltage $V_{pp}$. A first switching device is connected between an input/output (I/O) pad of the integrated circuit and the internal bus of the integrated circuit. A second switching device is connected between the circuit node in the integrated circuit and the internal bus. A high voltage detector detects the presence of the high voltage on the I/0 pad and, according to its presence or absence, drives gate control circuits which turn on either the first switching device or the second switching device. In another aspect of the invention, a circuit is provided for reducing the capacitance of the internal device connected to the input/output pad. Further circuitry is provided to prevent the flow of totem pole current through the first and second switches in the integrated circuit.

DETAILED DESCRIPTION OF A PREFERRED EMBODIMENT

Figure 1A:
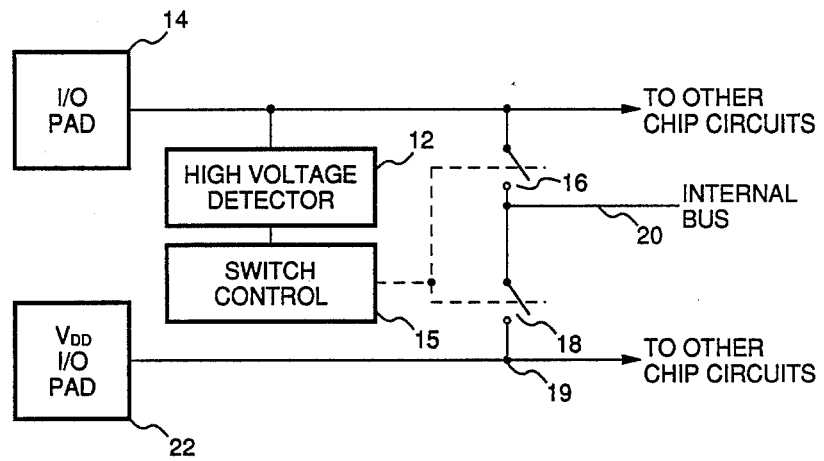
FIG. 1a is a block diagram of a preferred embodiment of the present invention.

Referring first to FIG. 1a, a circuit according to a preferred embodiment of the present invention is shown, including a high voltage detector 12 which senses a high voltage present on an I/O pad 14. High voltage detector 12 will be more fully described herein.

High voltage detector 12 drives a switch control circuit 15 which in turn drives two switches 16 and 18. Switch 16 is connected on one of its ends to I/O pad 14 and the other one of its ends to an internal bus 20. The second switch 18 is connected between the internal bus 20 and a circuit node 19 internal to the integrated cirucit, which, in FIG. 1a, happens to be connected to a second input output pad. In the embodiment of FIG. 1a, the other end of second switch 18 is shown connected directly to $V_{DD}$ I/O pad 22 which is bused to other chip circuits. Those of ordinary skill in the art will readily recognize that the other end of second switch 18 could be connected to a circuit node 19 carrying another voltage level in the chip such as ground, or any other intermediate signal.

Figure 1B:
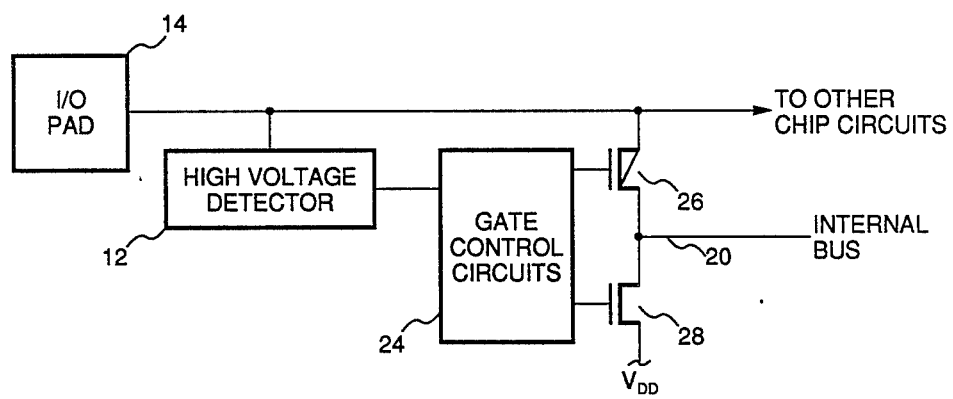
FIG. 1b is a block diagram of a preferred embodiment of the present invention showing NMOS and PMOS switching devices.

When the voltage at I/O pad 14 is below a certain threshold level, for example, seven volts, high voltage detector 12 is in a first state. When high voltage detector 12 is in its first state, it drives switch control 15 such that first switch 16 is opened and second switch 18 is closed. When, however, the voltage at I/O pad 14 rises above seven volts, high voltage detector 12 assumes the second state, and drives switch control 15 such that first switch 16 is closed and second switch 18 is open. Referring now to FIG. 1b, high voltage detector 12 is shown connected to I/O pad 14 and to gate control circuits 24 which drive first P-channel switching transistor 26 and first N-channel switching transistor 28. First P-channel switching transistor 26 is connected between I/O pad 14 and internal bus 20. First N-channel switching transistor 28 is connected between internal bus 20 and the internal circuit node 19, shown in FIG. 1b as $V_{DD}$. The state of high voltage detector 12 causes gate control circuits to place voltages on the gates of first P-channel switching transistor 26 and first N-channel switching transistor 28 to cause one or the other of those devices to be active depending on the state of high voltage detector 12. Those of ordinary skill in the art will readily recognize that the sizes of first P-channel switching transistor 26 and first N-channel switching transistor 28 will be relatively large, but will depend upon the particular application to which they are put.

Depending on the size of internal bus 20, and depending also on the nature and number of devices connected to internal bus 20, that bus may have an appreciable amount of capacitance. This capacitance could cause a large current spike to be passed through first P-channel switching transistor 26 from the high voltage at the I/O pad 14 when first P-channel switching transistor 26 is first turned on. Therefore, included within the gate control circuits 24 is a circuit designed to limit the amount of current which may flow through first P-channel switching device 26 until the node capacitance of internal bus 20 is charged.

In addition, the relative switching on and switching off times of first P-channel switching transistor 26 and first N-channel switching transistor 28 must be controlled such that there is no time when both devices are on. Such a condition could cause a potentially destructive totem pole current to flow through first P-channel switching transistor 26 and first N-channel switching transistor 28. Therefore, gate control circuits 24 contain circuitry which assures that both devices 26 and 28 will not be on at the same time.

Since, in most application first P-channel switching transistor 26 will be a large device, it will add a large amount of junction area to the I/O pad 14, which significantly increases the capacitance of the input pad. In some applications, this condition could present a problem in meeting input capacitance specifications, typically on the order of 5 pF. The present invention provides a circuit which decreases the pad capacitance.

Figure 2:
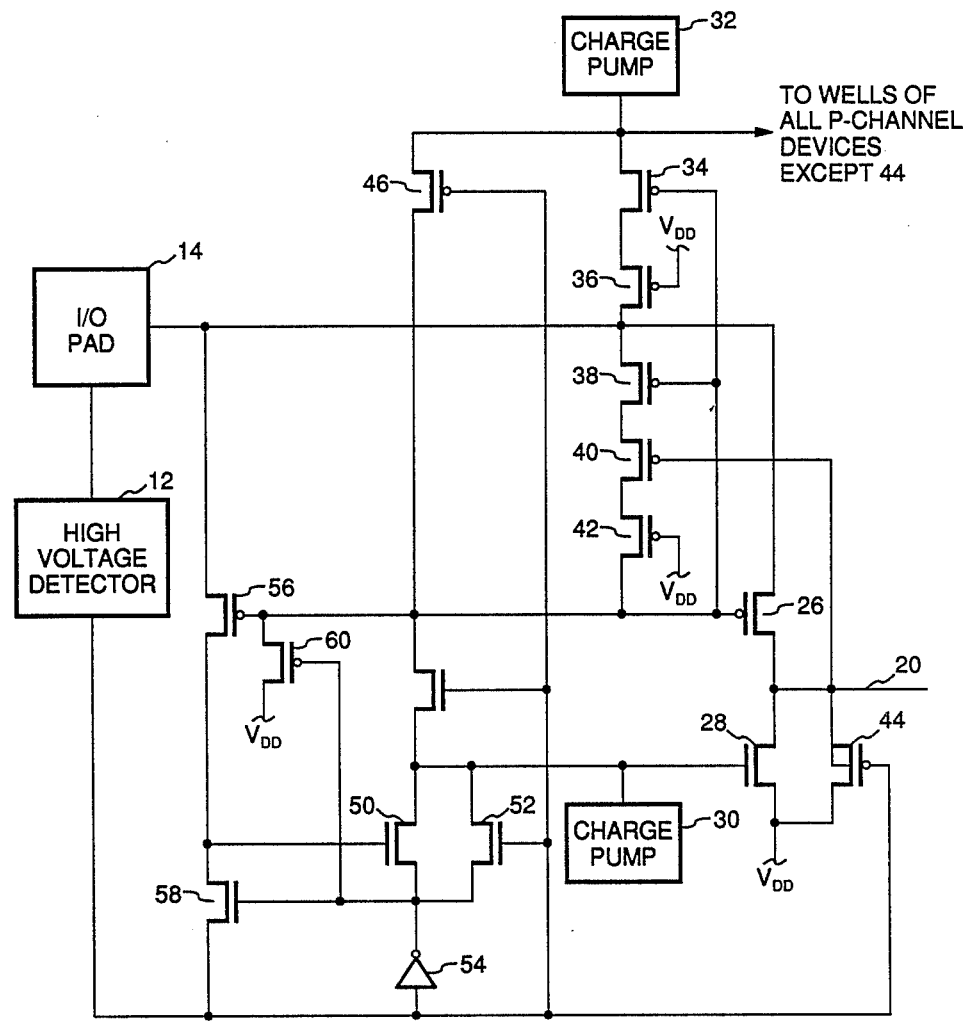
FIG. 2 is a schematic diagram of a presently-preferred embodiment of the present invention.

Referring now to FIG. 2, a detailed schematic diagram of a presently-preferred embodiment of the present invention is shown, including circuitry for preventing input current spikes and for preventing the flow of totem pole current. Additional circuitry for maintaining a low I/O pad 14 input capacitance is also shown.

I/O pad 14 is connected to the input of high voltage detector 12. I/O pad 14 is also connected to the source of P-channel switching transistor 26. The drain of first P-channel switching transistor 26 is connected to internal bus 20. Internal bus 20 is connected to the source of first N-channel switching transistor 28. The drain of first N-channel switching transistor 28 is shown connected to the internal $V_{DD}$ node, a source of fixed voltage on the chip.

For the purposes of FIG. 2, high voltage detector 12 has an output of a logic high voltage when its input, driven from the voltage on I/O pad 14, is higher than its voltage threshold, which may be approximately seven volts. When the voltage at I/O pad 14 is below the seven volt threshold of high voltage detector 12, the output of high detector 12 is a logic low level of approximately zero volts.

The gate of first N-channel switching transistor 28 is connected to the output of first charge pump 30. A second charge pump 32 is connected to the source of P-channel transistor 34. Charge pumps 30 and 32 may be conventional weak charge pumps. Such charge pumps are well-understood by those of ordinary skill in the art and selection of a charge pump for use as charge pumps 30 and 32 is simply a matter of design choice. The drain of P-channel transistor 34 is connected to the source of P-channel transistor 36. The drain of P-channel transistor 36 is connected to the source of P-channel transistor 38 and to I/O pad 14. The drain of P-channel transistor 38 is connected to the source of P-channel transistor 40. The drain of P-channel transistor 40 is connected to the source of P-channel transistor 42. The drain of P-channel transistor 42 is connected to the gate of P-channel switching transistor 26. The gates of P-channel transistor 34 and 38 ar connected together to the gate of P-channel transistor 26. The gates of P-channel transistor 36 and 42 are connected to $V_{DD}$. The gate of P-channel transistor 40 is connected to internal bus 20.

P-channel transistor 44 is connected in parallel with N-channel switching transistor 28. The source of P-channel transistor 44 is connected to its substrate connection in a P-well, and to internal bus 20. The drain of P-channel transistor 44 is connected to $V_{DD}$. The gate of P-channel transistor 44 is connected to the output of high voltage detector 12.

Second charge pump 32 is also connected to the source of P-channel transistor 46. The drain of P-channel transistor 46 is connected to the gate of P-channel transistor 26 and to the drain of N-channel transistor 48. The source of N-channel transistor 48 is connected to the drains of N-channel transistors 50 and 52. The sources of N-channel transistors 50 and 52 are connected together to the output of inverter 54. The input of inverter 54 is connected to the output of high voltage detector 12. The gates of P-channel transistor 46, N-channel transistor 48, and N-channel transistor 52 are connected, as is the gate of P-channel transistor 44, to the output of high voltage detector 12.

I/O pad 14 is connected to the source of P-channel transistor 56. The gate of P-channel transistor 56 is connected to the common connection of the drain of P-channel transistor 46 and the drain of N-channel transistor 48. The drain of P-channel transistor 56 is connected to the drain of N-channel transistor 58. The source of N-channel transistor 58 is connected to the output of high voltage detector 12. The gate of N-channel transistor 50 is connected to the common connection of the drain of N-channel transistor 58 and the source of P-channel transistor 56. The gate of N-channel transistor 58 is connected to the output inverter 54 and to the gate of N-channel transistor 60. The drain of N-channel transistor 60 is connected to $V_{DD}$ and the source of N-channel transistor 60 is connected to the gate of P-channel transistor 56.

The circuitry shown in FIG. 2 driving switching transistors 26 and 28 functions as follows. Transistors 34 and 36 prevents the turning on of a parasitic bipolar device associated with P-channel switching transistor 36 by shorting the well connection to the source connection of P-channel switching transistor 26. Whenever P-channel switching transistor 26 is first turned on, there is a chance that there an inherent parasitic device will be turned on because the charge pump 32 will be overpowered by the high voltage detector circuitry. The shorting of the well to the source of P-channel switching transistor 26 effectively shorts out the base emitter junction of the parasitic bipolar transistor, thus preventing it from turning on.

When high voltage is first applied to I/O pad 14 and to this circuit, transistors 38, 40 and 42 come into play. Transistor 38 mirrors the current through switching transistor 26. As long as that current is relatively high, transistor 38 prevents transistor 26 from turning on hard like a switch. Instead, transistor 26 acts like a current source and limits the current through it to a value determined by the current flowing through P-channel transistor 38 and the gain ratio of transistors 26 and 38. It will continue to act as a current source until the voltage on the internal bus 20 is about 1 P-MOS $V_t$ less than the voltage on I/O pad 14. At that point, P-channel transistor 40 shuts off and therefore removes the clamping voltage which was on the gate of switching transistor 26. The gate of transistor 26 is than allowed to be pulled all the way to ground thus turning on transistor 26 very hard. This avoids any large current spikes to the internal bus 20 through switching transistor 26. Such a current spike can cause a great deal of noise. It may also tend to generate a lot of substrate current which in turn can cause latchup and destructive breakdown.

P-channel transistor 56, N-channel transistor 58, and N-channel transistor 50 prevent the two switching transistors, P-channel transistor 26 and N-channel transistor 28, from being on simultaneously and drawing totem pole current. If any current flows through P-channel transistor 26, it will be mirrored in P-channel transistor 56. If that current is large enough it will overpower N-channel transistor 58 and turn on N-channel transistor 50. When N-channel transistor 50 turns on it connects the gate of N-channel switching transistor 28 to ground or $V_{DD}$, (the output of inverter 54) thus turning if off. This prevents N-channel switching transistor 28 from turning on until P-channel switching transistor is turned off.

The size of these transistors will effect what the trip point will be. For a design wherein a current on the order of 1 milliamp causes the feedback loop to shut off, switching transistor 28 is 1000μ/1.8μ wide, transistor 56 is 40μ/1.8μ wide and transistor 58 is 5μ/20μ.

When the output of high voltage detector 12 switches, indicating that the high voltage is no longer present, it is desired to turn off switching transistor 26 to disconnect internal bus 20 from the I/O pad 14 and to turn on N-channel switching transistor 28 to connect the source of internal voltage (shown in FIG. 2 as $V_{DD}$) to internal bus 20. N-channel transistors 48 and 52, turn off and the output of inverter 54 becomes high. Charge pump 32 begins to pull up the voltage on the gate of P-channel switching transistor 26. Initially, the voltage on the gate of P-channel switching transistor 26 is at $V_{DD}$ minus one $V_t$ because of N-channel transistor 60. When the high voltage detector changes state, N-channel transistor 26 pulls the gate of P-channel switching transistor 26 up to a threshold below $V_{DD}$ and then the charge pump 32 pulls its gate the rest of the way up through P-channel transistor 46. This pump will eventually pull the gate of P-channel switching transistor 26 to between 10 v and 16 v, thus turning it off. Once charge pump 32 has turned P-channel switching transistor 26 off, charge pump 30 can take over and begins to turn on N-channel switching transistor 28. Charge pump 30 pulls the gate of N-channel transistor 28 to somewhere between 10 and 16 volts, thus turning on N-channel switching transistor 28 very hard.

The well of P-channel transistor 44 is tied to its source, and its drain is tied to $V_{DD}$. The purpose of this device is to keep the internal bus 20 from being at a voltage significantly below that of the power supply $V_{DD}$. For example, when $V_{DD}$ is first applied to this circuit, all of the internal nodes will be at zero volts. When $V_{DD}$ rises to its desired level, current will flow either through the well diode or through the MOS transistor into internal bus 20. The MOS transistor will turn on when $V_{DD}$ rises to about 1 $V_t$. This device is only needed where it is desired to pull the internal bus 20 up to $V_{DD}$.

N-channel transistor 60 is present to handle very fast switchings on the I/O pad 14. If the I/O pad 14 were to be taken to ground very fast, it would be possible for internal bus 20 to be pulled towards ground through P-channel switching transistor 26. N-channel transistor 60 clamps the gate voltage of transistor 26 to one voltage threshold below $V_{DD}$ so that transistor 26 will shut off when I/O pad 14 falls to approximately $V_{DD}$, no matter how fast the voltage on I/O pad 14 is ramped.

One of the other functions of charge pump 32, which is connected to the wells of all of the P-channel devices except P-channel transistor 24, is to heavily reverse bias the junctions on I/O pad 14 and thus cut the capacitance on that pad roughly in half. In addition, the heavy reverse biasing on this junction means that if a noise spike appears on I/O pad 14 it has to be very large to have any chance of forward biasing that P+ junction in the well. Thus it supplies an extra measure of immunity to latchup problems.

Figure 3:
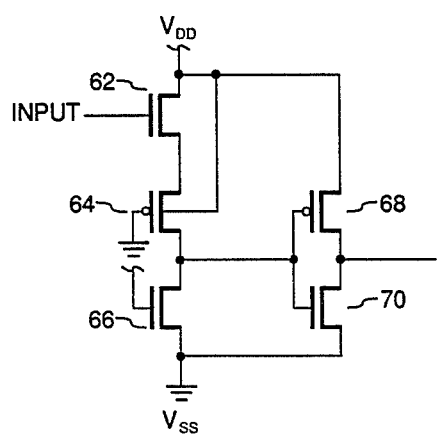
FIG. 3 is a schematic diagram of a presently-preferred embodiment of a high voltage detector for use with the present invention.

Referring now to FIG. 3, a schematic diagram for a presently-preferred embodiment of a high voltage detector circuit for use in the present invention is disclosed. The high voltage detector circuit of FIG. 3 includes a first N-channel MOS transistor 62, a first P-channel MOS transistor 64 and a second N-channel MOS transistor 66. P-channel transistor 68 and N-channel transistor 70 form an inventer following the high voltage detector circuit.

The high voltage detector circuit operates as follows. The detector is composed of two ratioed N-channel devices, 62, and 66. Device 66 is always on, s if device 62 is off (a low voltage on its gate), the output feeding the inverter is low. If, however, the gate voltage on N-channel transistor 62 is high enough, the current through N-channel MOS transistor 62 will over power N-channel MOS transistor 66, and the output feeding the inverter will go high. The ratio between devices 62 and 66 determines at what voltage device 62 overpowers device 66. Since the input of the high voltage detector is a gate, there is no potential for latchup since there is no junction present at the input pad.

P-channel MOS transistor 64 reduces the current consumed by the high voltage detector. P-channel transistor 64 will not turn on until the gate of N-channel transistor 62 is several volts above ground, thereby reducing the input voltage range over which current will flow. P-channel MOS transistor 64 also acts to square-up the output of the first stage, thus reducing the totem pole current in the inventor stage.

P-channel MOS transistor 68 and N-channel MOS transistor 70 together comprise a conventional CMOS inverter. This inverter creates CMOS voltage levels from the output of the high voltage detector. The ratio of P-channel transistor 68 and N-channel transistor 70 can also be used, along with the ratio of devices 62 and 66, to adjust the trip point of the high voltage detector. If N-channel transistor 62 is about $5\mu/30\mu$, P-channel MOS transistor 64 is about $5\mu/2.8\mu$, N-channel transistor 66 is about $5\mu/20\mu$, P-channel transistor 68 is about $10/2.8\mu$, and N-channel transistor 70 is about $20\mu/2\mu$, and the gate oxide thickness is approximately 400 Å, the trip point of the circuit will be between 7 and 12 volts, depending on process variations and $V_{DD}$ variation of from between 4 to 6 volts.

While a presently-preferred embodiment of the invention has been disclosed, those of ordinary skill in the art will, from an examination of the within disclosure and drawings be able to configure other embodiments of the invention. These other embodiments are intended to fall within the scope of the present invention which is to be limited only by the scope of the appended claims.

What is claimed is:

1. An integrated electronic circuit for selectively switching a bi-directional, low resistance circuit path between an internal bus in an integrated circuit and an input/output pad of said integrated circuit and a circuit node in said integrated circuit, including
   a first MOS switching transistor connected between said input/output pad and said internal bus,
   a second MOS switching transistor connected between said circuit node and said internal bus,
   high voltage detection means for detecting whether the voltage on said input/output pad is above a preselected threshold level,
   switch control means responsive to said high voltage detection means, for activating said first switching transistor if high voltage is present at said input/output pad, and for activating said second switching transistor if high voltage is not present at said input/output pad, said switch control means adapted to limit current flow from said input/output pad to said internal bus until the potential difference between said input/output pad and said internal bus is less than a predetermined amount,
   means, coupled with said switch control means, for preventing said first and said second switching transistors from being activated at the same time.

2. The integrated electronic circuit of claim 1 further including
   means, connected to said first MOS switching transistor, for reducing the capacitance of said input/output pad.

* * * * *